(12) United States Patent
Benzel et al.

(10) Patent No.: US 7,493,819 B2
(45) Date of Patent: Feb. 24, 2009

(54) MICROMECHANICAL PRESSURE SENSOR SYSTEM

(75) Inventors: Hubert Benzel, Pliezhausen (DE); Roland Guenschel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/592,904

(22) Filed: Nov. 2, 2006

(65) Prior Publication Data

US 2007/0113661 A1     May 24, 2007

(30) Foreign Application Priority Data

Nov. 11, 2005   (DE) .................. 10 2005 053 861

(51) Int. Cl.
*G01L 7/08* (2006.01)
*G01L 9/06* (2006.01)
*G01L 9/12* (2006.01)
*H01L 21/00* (2006.01)

(52) U.S. Cl. ............................ 73/715; 73/777; 73/723; 257/415; 438/53

(58) Field of Classification Search .................. 73/715, 73/721, 777, 729.2, 754, 723; 361/283.4; 257/415, 698; 438/53
See application file for complete search history.

(56) References Cited

U.S. PATENT DOCUMENTS

| 4,222,277 | A | * | 9/1980 | Kurtz et al. ................... 73/721 |
| 4,774,843 | A | * | 10/1988 | Ghiselin et al. ............... 73/727 |
| 5,511,428 | A | * | 4/1996 | Goldberg et al. .............. 73/777 |
| 6,388,279 | B1 | * | 5/2002 | Sakai et al. .................. 257/254 |
| 6,550,337 | B1 | * | 4/2003 | Wagner et al. ................ 73/715 |
| 2007/0267708 | A1 | * | 11/2007 | Courcimault ............... 257/414 |

FOREIGN PATENT DOCUMENTS

| DE | 100 32 579 | 1/2002 |
| DE | 103 23 559 | 12/2004 |

\* cited by examiner

*Primary Examiner*—Harshad Patel
*Assistant Examiner*—Punam Patel
(74) *Attorney, Agent, or Firm*—Kenyon & Kenyon LLP

(57) ABSTRACT

A micromechanical pressure sensor includes a substrate having a front side and a back side, the front side facing a medium and the back side being situated on the opposite side of the substrate. A sensor diaphragm having at least one sensor area is situated on the front side, and a recess or cavity is situated behind the sensor diaphragm, and electrical contacting is provided on the back side.

7 Claims, 8 Drawing Sheets

MICROMECHANICAL PRESSURE SENSOR SYSTEM

FIELD OF THE INVENTION

The present invention relates to a micromechanical pressure sensor system.

BACKGROUND INFORMATION

A micromechanical pressure sensor is described in published German patent document DE 103 23 559, which pressure sensor is based on the piezoresistive transducer principle for converting a mechanical force into an electrical signal. A conventional design of a micromechanical pressure sensor having piezoresistive transducer elements is illustrated in FIG. 1, in which design a substrate having an anodically etched diaphragm is anodically bonded to glass. Furthermore, published German patent document DE 100 32 579 discusses manufacturing the diaphragm and a cavity situated behind the diaphragm from porous silicon, which type of a sensor design is illustrated in FIG. 2. The chip is glued to a ceramic or into a pre-mold housing, and for protection against environmental influences it is passivated using gel which is held on the chip via a gel ring. A disadvantage of the passivation using gel is that gas, in particular under high pressure, is diffused into the gel. When the dissolved gas returns to the gaseous state, e.g., as the result of a pressure drop, the bonding wires running through the gel which produce the contact to the chip may be destroyed.

SUMMARY OF THE INVENTION

The sensor system according to the present invention has the advantage that the sensor chip may be electrically contacted from its back side, i.e., from the side facing away from the medium, and in this manner the electrical connection area is separated from the area which is exposed to the medium, and the use of passivating gel in the area which is exposed to the medium may advantageously be omitted. The design of the sensor system according to the present invention is simple, economical to manufacture, and suitable for micromechanical absolute or differential pressure sensors. The sensor system according to the present invention may be used in a particularly advantageous manner as a pressure sensor in higher pressure ranges, for example at 10 bars and above. As a result of the design according to the present invention, the sensor system is also particularly suited for absolute or differential pressure measurement in chemically corrosive surroundings, for example in the vicinity of particle filters. Additional fields of application in which the use of a passivating gel is not possible, or at the minimum difficult, may advantageously be encompassed by the sensor system according to the present invention, e.g., as a sensor for vehicle tire pressures or as a pressure sensor for airbags.

Contacting may be achieved through the wafer, i.e., through the substrate. To this end, the sensor system has at least one contact hole, e.g., four contact holes, which extend from the back side of the substrate into same, e.g., approximately up to the front side of the substrate. The back side of the substrate is provided, at least in parts around the contact holes, with an electrically conductive layer which extends up to the contact holes, thereby providing an electrically conductive connection from the back side and up to the contact holes, and therefore on the front side of the substrate.

Electrical contacting between the sensor area and the back side may be provided via metallic conductors and/or doped areas in the substrate. Using metal-plating, an electrical contact or contact area is advantageously provided on the back side which may be connected in an electrically conductive manner to a printed circuit board either directly, for example via flip chip contacting, or via a bonding wire. According to the present invention, a deflection of the sensor diaphragm may be detected using piezoresistive or capacitive means. It is particularly advantageous when the sensor system has stress-decoupling means which cause the sensor diaphragm to be decoupled from the surroundings, thereby reducing an influence on the measurement. To this end, the sensor diaphragm is, for example, annularly surrounded by a circumferential groove or a decoupling diaphragm. In the same way as the contact hole, the stress-decoupling means may be provided by a known, suitable etching process.

Also provided is a method for manufacturing a sensor system according to the present invention, the electrical contact advantageously being provided between the sensor area and the back side by first introducing at least one contact hole into the substrate from the back side, e.g., by etching, and then providing the back side and/or the contact hole, at least in parts, with a metal layer, e.g., by use of a photolithography process and/or sputtering and/or vapor deposition. The electrical contact may be made via metallic conductors and/or by doping of areas of the substrate. In this manner the sensor system according to the present invention may advantageously be manufactured in a simple and economical manner.

In the method according to the present invention, it is further provided that, for introducing the sensor diaphragm and/or the decoupling diaphragm into the substrate, a sub-area of the substrate is porously etched, e.g., having a porosity of greater than 50%, in particular greater than 80%, and the cavity is formed by displacing or removing parts of the substrate in the porously etched sub-area. It is then advantageously possible according to the present invention to form the cavity without introducing access points and without the use of undercutting methods.

DETAILED DESCRIPTION

Figure 1:
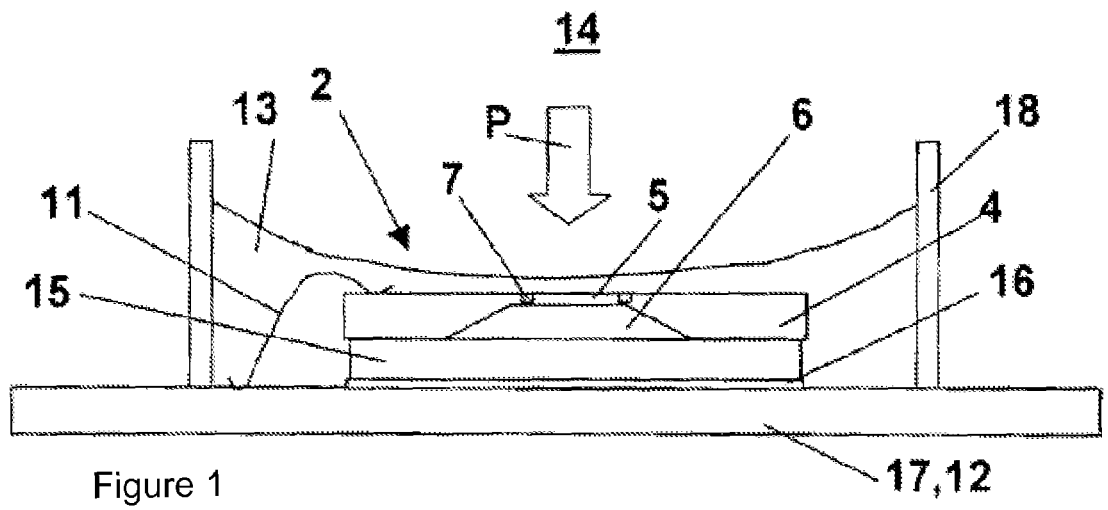
FIGS. 1 and 2 show pressure sensors having conventional sensor designs.

FIG. 1 illustrates a conventional design of a micromechanical silicon pressure sensor having piezoresistive transducer elements 7. A substrate 4 has a front side 2 which faces a pressure medium 14. The pressure from medium 14 acts in the direction of arrow P on the pressure sensor. Situated on front side 2 of substrate 4 is a diaphragm 5 having sensor areas 7, in the present case having piezoresistive transducer elements 7. Behind diaphragm 5, a recess 6 is anisotropically etched into substrate 4. As the result of anodic bonding of substrate 4 to Pyrex glass 15, recess 6 forms a cavity 6 between substrate 4 and Pyrex glass 15. The composite of substrate 4 and Pyrex glass 15 is connected to a printed circuit board 12, i.e., a housing 17, for example a pre-mold housing, via an adhesive layer 16 or solder layer 16. Front side 2 of substrate 4 is connected to printed circuit board 12 in an electrically conductive manner via a bonding wire 11. A gel ring 18 on printed circuit board 12, i.e., housing 17, encloses the system and is filled with a passivating gel 13. The illustrated sensor is an absolute pressure sensor. The elongation of sensor diaphragm 5 due to the pressure from medium 14 is measured by piezoresistive transducer elements 7, the signals from which may be evaluated by an integrated circuit.

Figure 2:
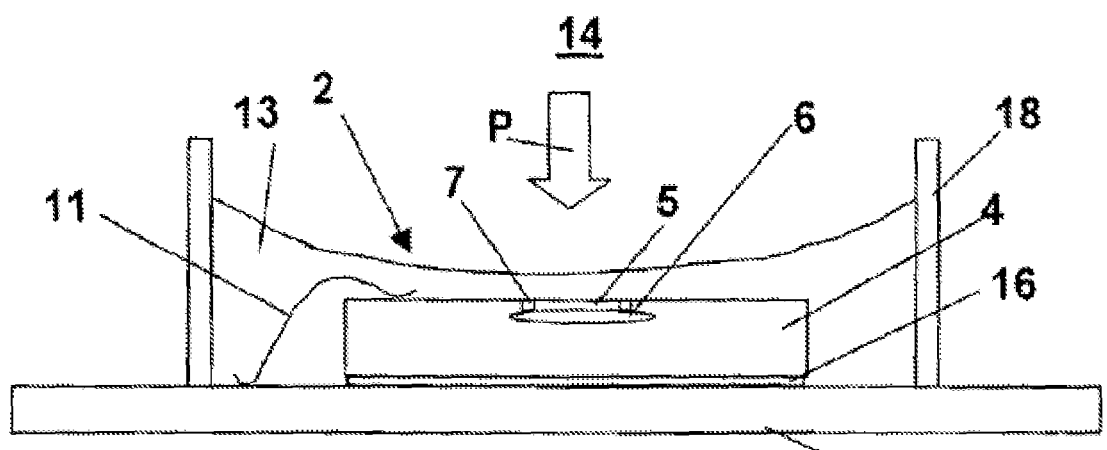

FIG. 2 illustrates an absolute pressure sensor having a conventional design. Sensor diaphragm 5 having cavity 6 situated behind the diaphragm is produced via a surface micromechanical method using porous silicon, as described in published German patent document DE 100 32 579. Substrate 4 may advantageously be glued onto a printed circuit board 12, i.e., a housing 17. The anodic bonding to glass may therefore be omitted.

Figure 3:
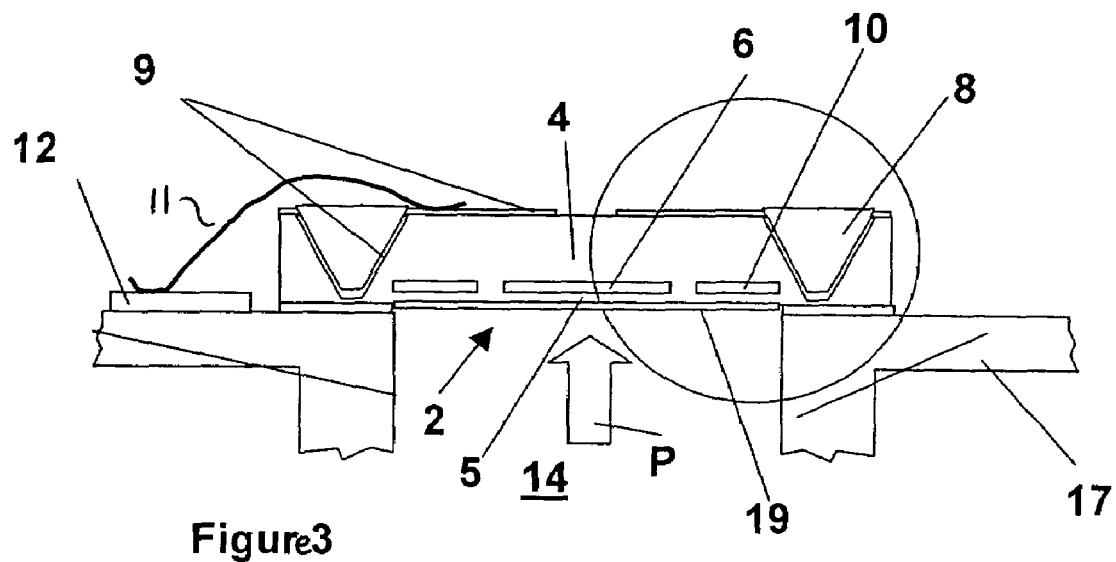
FIG. 3 shows a sectional illustration of a first example embodiment of a sensor system according to the present invention.

A first example embodiment of a sensor system according to the present invention is illustrated in a sectional view in FIG. 3. Substrate 4 is connected, in particular glued or soldered, at a sub-area of front side 2 thereof to a housing 17, housing 17 being designed in such a way that the pressure from medium 14 is able to act upon front side 2, in particular on sensor diaphragm 5, as indicated by arrow P. Substrate 4 has contact holes 8 which, for example, may be anisotropically etched. On the walls of contact holes 8, an electrically conductive layer 9 is provided, at least in parts, which extends into the area of back side 3. Electrically conductive layer 9 is, for example, a metal layer, composed of, for example, aluminum or an alloy of chromium and gold or of titanium and gold, which is applied and may be patterned. A photolithography process may be used for the texturing, in which a photoresist may be illuminated with sufficient image definition on topographical areas, in particular in deep contact holes 8. A lacquer spray process, for example, is advantageous for applying the lacquer. However, other methods for applying electrically conductive layer 9, for example sputtering using a shadow mask, or vapor deposition, may also be used.

Sensor diaphragm 5 is produced via, for example, a surface micromechanical method using porous silicon in sub-areas of substrate 4. According to the present invention, a stress-relieving means 10 may be provided, an example of which stress-relieving diaphragm 10 is illustrated in FIG. 3, which diaphragm 10 surrounds sensor diaphragm 5 in the substrate plane. Stress-relieving diaphragm 10 may likewise be produced according to the above-referenced micromechanical method.

From contact surface 9 on back side 3 it is possible to produce a contact to a printed circuit board 12 using bonding wires 11, for example. Contact surfaces 9 and bonding wires 11 are situated on back side 3 of substrate 4 facing away from medium 14, and therefore are very well protected from corrosion. It is clear that it is not necessary to provide a passivating gel layer on front side 2 of substrate 4 facing medium 14. In this manner, gaseous medium 14 is advantageously prevented from diffusing into the gel. The surface of front side 2 may instead be coated with a passivation, protective, or non-adhesive layer 19 which is used, for example, as corrosion protection. It is understood by those skilled in the art that back side 3 may also be covered with a passivating gel, for example to protect contact surfaces 9, since according to the present invention this area has no contact with medium 14.

Figure 4:
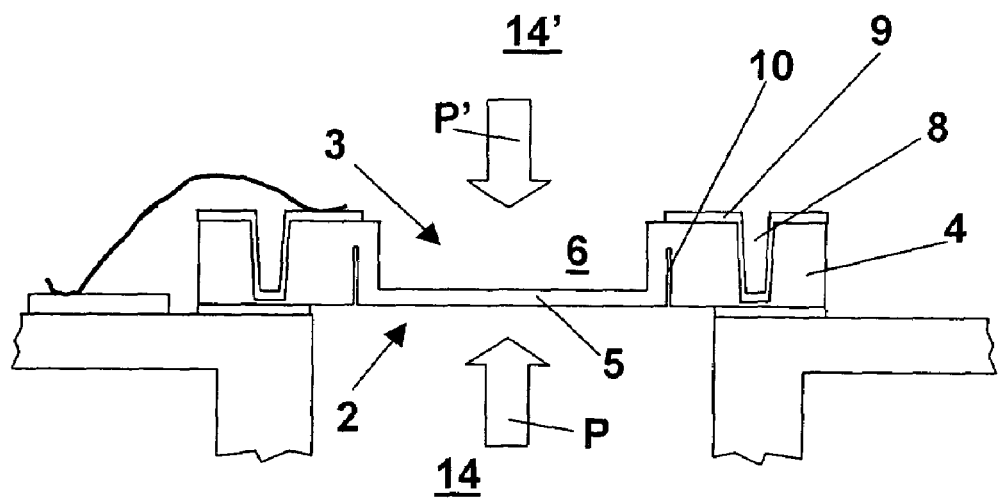
FIG. 4 shows a sectional illustration of a second example embodiment of a sensor system according to the present invention.

FIG. 4 shows a second example embodiment of the sensor system according to the present invention as a differential pressure sensor. Front side 2 of the substrate is acted upon by the pressure from medium 14, represented by arrow P, whereas oppositely situated back side 3 is acted upon by the pressure from an additional medium 14', represented by arrow P'. Recess 6 on back side 3 of sensor diaphragm 5 may be produced using a trench process, for example. In this case the recess does not form a cavity. The elongation of sensor diaphragm 5 is a function of the pressure difference between the two media 14 and 14'.

In the illustrated example, stress-relieving means 10 are provided in the form of a trenched circumferential groove 10. Contact holes 8 are also introduced into the substrate 4 using a trench method.

Figure 5:
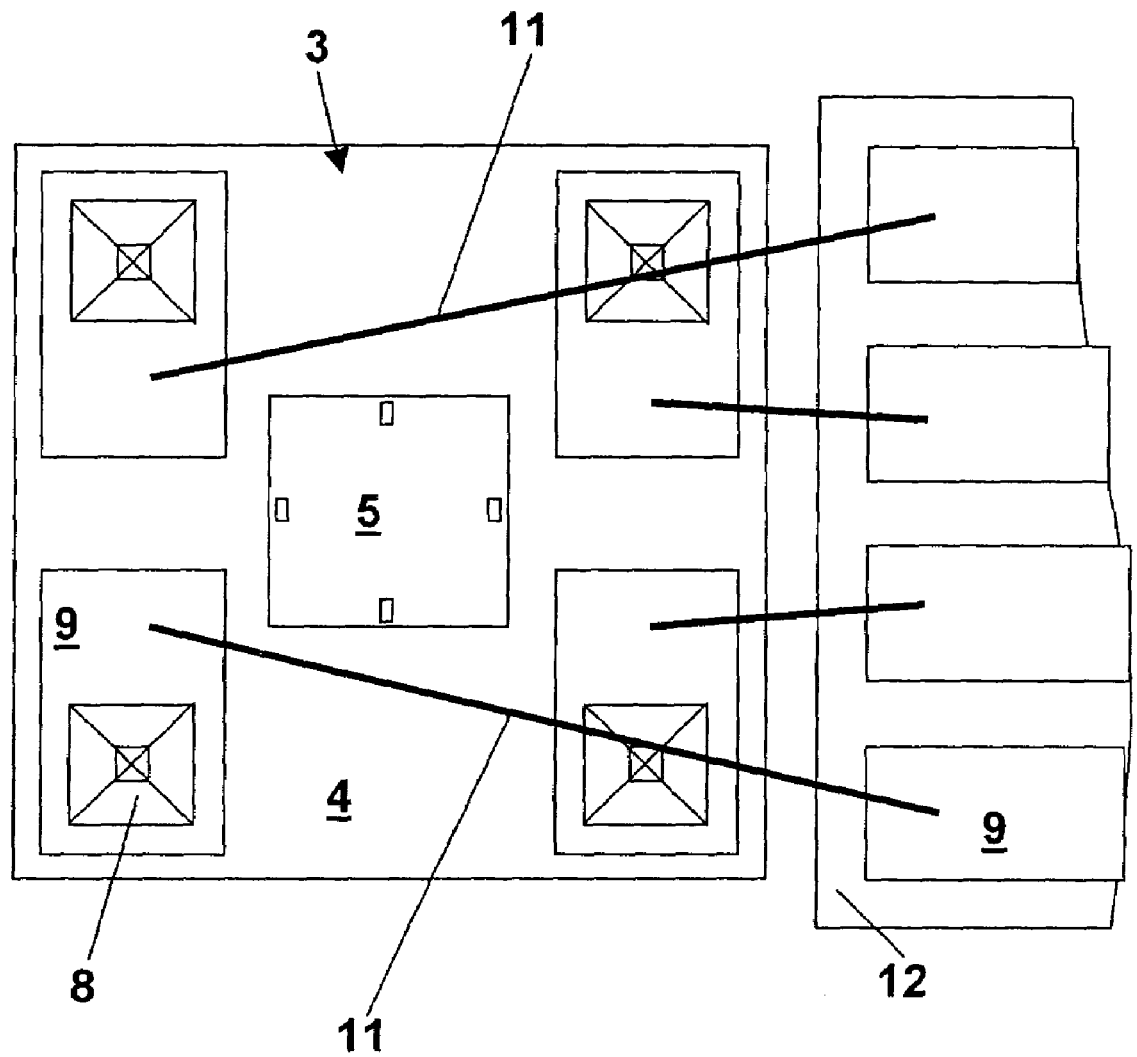
FIG. 5 shows a top view of the first example embodiment according to FIG. 3.

FIG. 5 illustrates a top view of back side 3 of the sensor system from FIG. 3. Sensor diaphragm 5 together with sensor areas 7 located on front side 2 is illustrated by dashed lines. Four contact areas 9 are illustrated on back side 3 of substrate 4, each making contact with an additional contacting surface 9, for example a printed conductor on printed circuit board 12, via a respective bonding wire 11. The metal-plating of each contact area 9 on back side 3 extends up to each of the four contact holes 8. Electrically conductive layer 9 forms a portion of the contacting between back side 3 of the substrate and sensor areas 7 located on front side 2, i.e., on sensor diaphragm 5. The contacting will be discussed in greater detail with reference to FIGS. 11 through 14, described below.

FIGS. 6 through 10 illustrate various views of the first and second example embodiments of sensor system 1 according to the present invention having alternative contacting. FIGS. 6 through 10 are collectively described below. A simple and economical design of a micromechanical piezoresistive absolute or differential pressure sensor having a plated-through wafer and an annular grounding solder is achieved by alternative contacting. Similar to contacting of back side 3 via bonding wires 11, it is also possible in alternative contacting to have medium 14 acting upon sensor system 1 from front side 2 and to be electrically contacted from back side 3. Soldering of sensor system 1 or substrate 4 of sensor system 1 using an annular grounding line 31 advantageously allows applications in chemically corrosive surroundings, even at high pressures. Grounding line 31 provides stability and protects the internal contacts. As a result of the chip-side separation of media access and electrical contacting, it is possible to avoid passivating gel in the area exposed to medium 14. Optionally, a stress-decoupling means 10 may be used to keep the installation stress away from sensor diaphragm 5.

Figure 6:
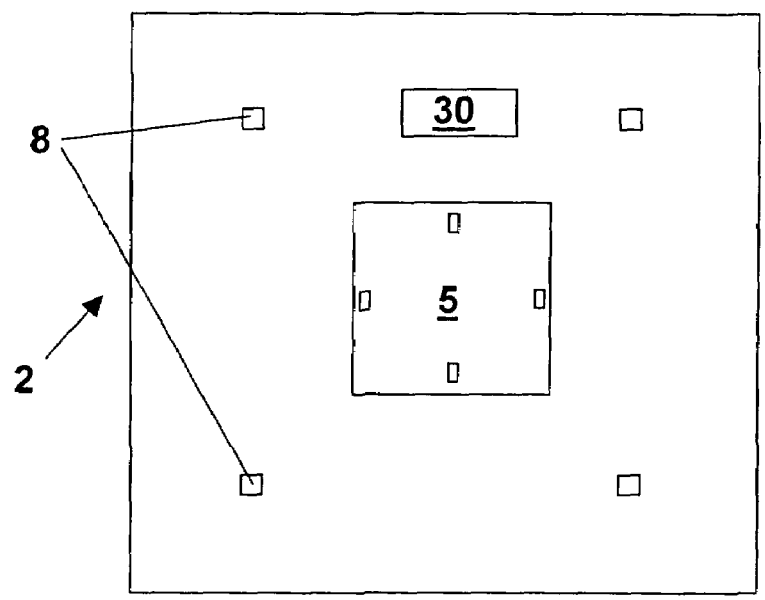
FIGS. 6 through 10 show various views of the first and second example embodiments of a sensor system according to the present invention having alternative contacting.
Figure 7:
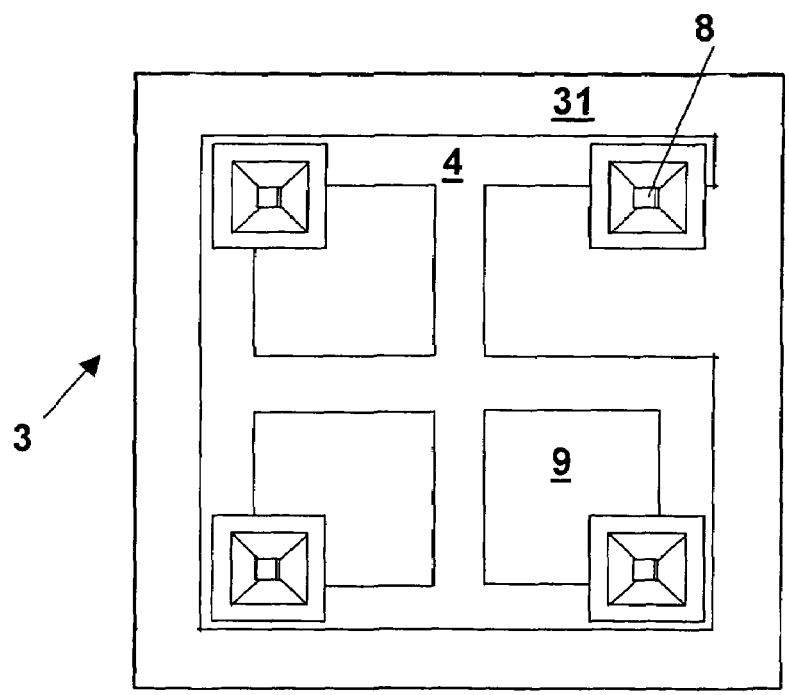

FIG. 6 illustrates front side 2 of sensor system 1 according to the present invention provided for alternative contacting, having the front side of contact holes 8, sensor diaphragm 5, and a circuit area 30 of an evaluation circuit which optionally is monolithically integrated with sensor system 1. FIG. 7 illustrates back side 3 of sensor system 1 (also shown in FIG. 8), provided for alternative contacting, together with contact holes 8 for circumferential grounding line 31, the electrically conductive layer 9 applied in the area of contact holes 8, and a partial area of substrate 4. Electrically conductive layer 9, i.e., the contact surface, is protected from corrosive media by grounding ring 31.

Figure 8:
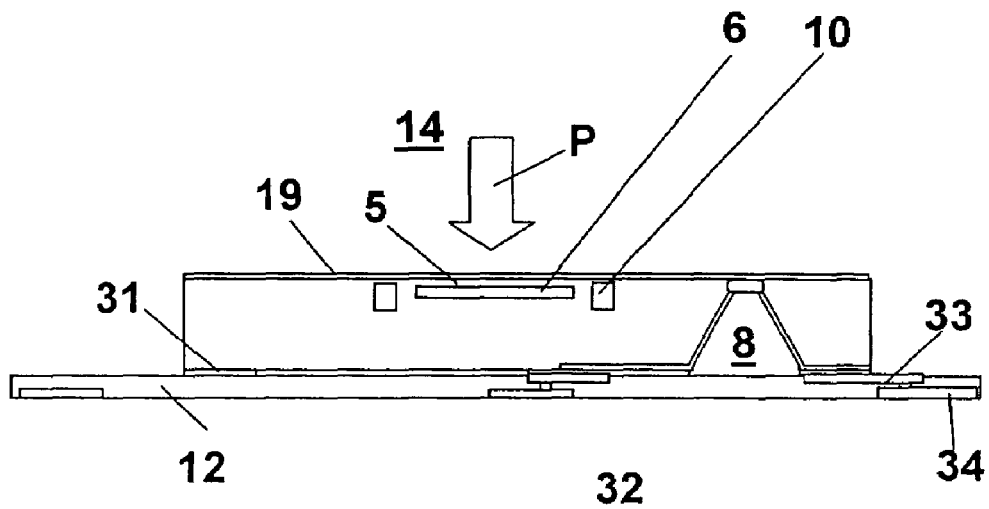
Figure 9:
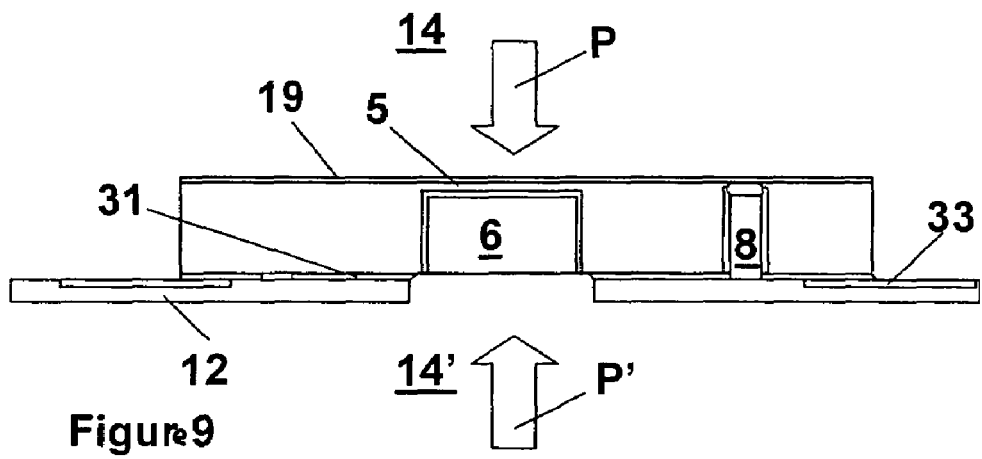
Figure 10:
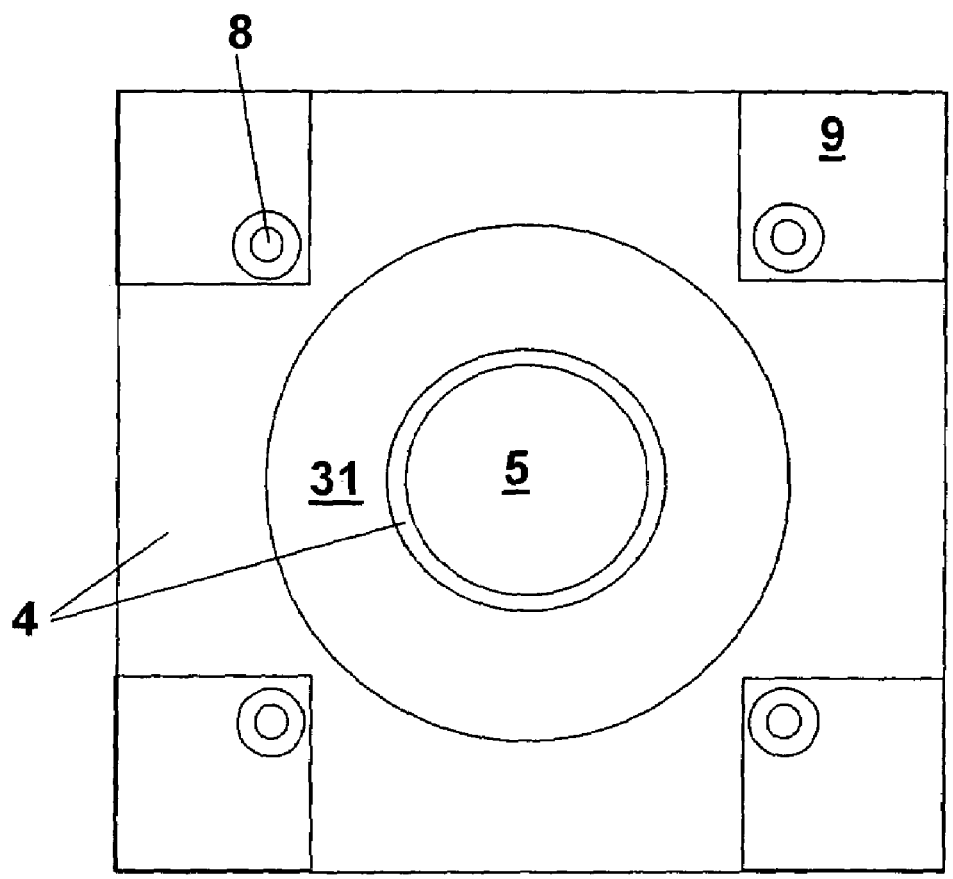

FIGS. 8 and 9 illustrate sectional representations of sensor system 1 provided according to the present invention for alternative contacting, FIG. 8 showing an absolute pressure sensor and FIG. 9 showing a relative pressure sensor. Sensor system 1 is attached to a printed circuit board 12 via grounding line 31 and a connection, in particular a soldered connection. Pressure P of medium 14 (or pressures P, P' of media 14, 14') cause(s) a deflection of sensor diaphragm 5 above cavity 6 or recess 6. Stress-decoupling means 10 are optionally present. Contact hole 8 and protective layer or non-adhesive layer 19 are also illustrated. Reference numerals 33 and 34 denote a printed conductor and a back bonding pad on printed circuit board 12, respectively. Reference numeral 32 represents a connecting means, e.g., solder or adhesive, for the connection between printed circuit board 12 and sensor system 1. FIG. 10 illustrates back side 3 of the sensor system according to FIG. 9. In this case, grounding line 31 provided around sensor diaphragm 5 protects external contact areas 9 from influences of media 14, 14'.

Each of FIGS. 11 through 14 illustrates an example embodiment of the detail area within the circle shown in FIG. 3, showing the contacting between sensor area 7 and back side 3 of substrate 4. Contact hole 8 extends from back side 3 into substrate 4. Cavity 6 is in substrate 4, in addition to stress-relieving means 10 adjacent to an epitaxial layer 20 of substrate 4. Epitaxial layer 20 is composed primarily of monocrystalline silicon on which piezoresistive resistors 7 are provided via doping. Gluing or soldering 16 connects housing 17, i.e., printed circuit board 12, and front side 2. A non-adhesive or protective layer 19 as well as an oxide layer 21 are applied to the surface of front side 2.

Sensor area 7 is illustrated as a piezoresistor 7 in sensor diaphragm 5. This piezoresistor may be formed, for example, by a base-doped (p) area 7 of sensor diaphragm 5. This piezoresistor is connected to an insulated area 22, likewise in base doping (p), which surrounds sensor diaphragm 5 and is contacted by a metal conductor 23. Metal conductor 23, which is made of aluminum, for example, extends through oxide layer 21 in the direction of front side 2, continues between oxide layer 21 and protective layer 19, and extends into the area of contact hole 8, once again passing through oxide layer 21 in the direction of back side 3.

Figure 11:
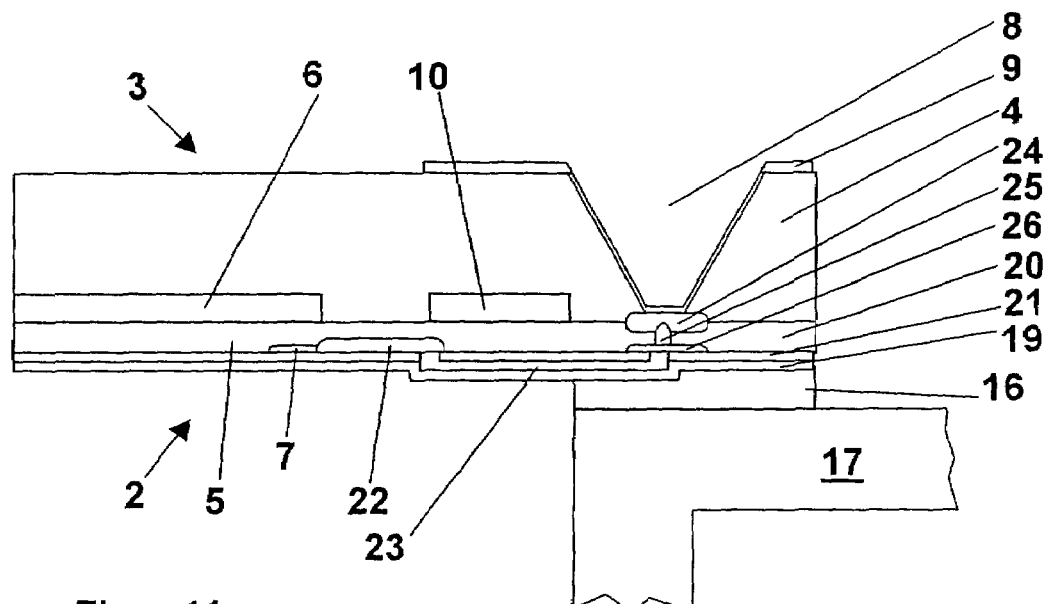
FIGS. 11 through 14 show detailed sectional views of example embodiments of the contacting corresponding to the configuration shown in FIG. 3.

In FIG. 11, contact hole 8 is formed by anisotropic etching, for example by using potassium hydroxide (KOH) or tetramethylammonium hydroxide (TMAH). In the etching process, a pn etching stop ensures that the etching process ends at a pn transition from substrate 4 to an area having conductive layer doping 24 at the boundary of epitaxial layer 20. Electrically conductive layer 9 of contact hole 8 is thus in contact with the area having conductive layer doping 24. Metal conductor 23 has a contact to an area having emitter doping 26, which is connected to conductive layer-doped area 24 via an area having collector doping 25. Contacting from piezoresistor 7 up to metal-plated layer 9 on back side 3 is thus provided which has metallic conductors in parts and doped semiconductor areas in parts.

Figure 12:
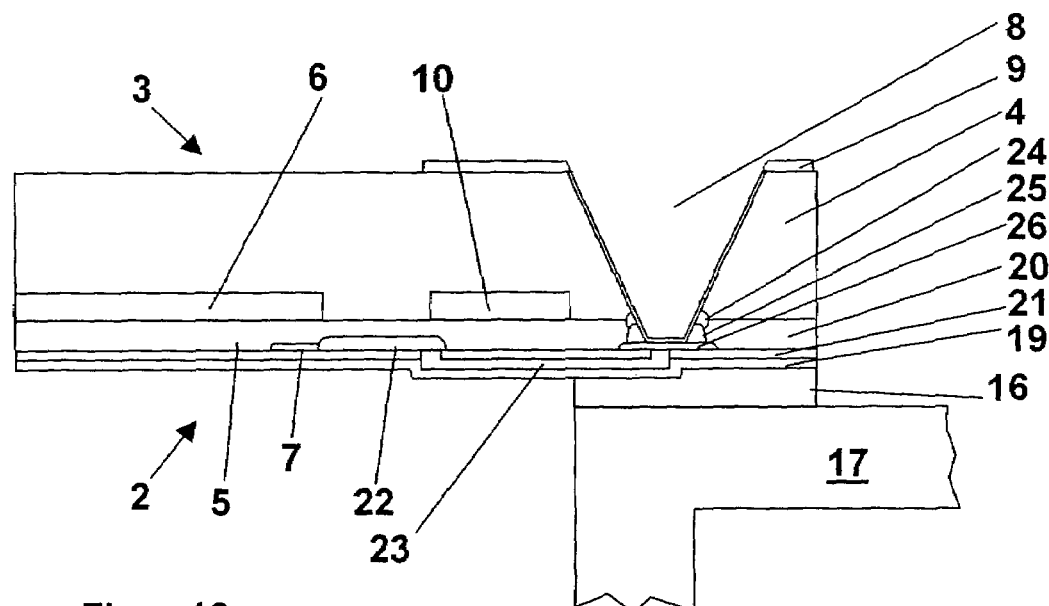

FIG. 12 shows a further exemplary embodiment of the contacting according to the present invention. Contact hole 8 is, for example, anisotropically etched down to oxide layer 21. It is also possible to use a trench etching process. The latter would be stopped by oxide layer 21. In contrast, the anisotropic etching could likewise continue as far as protective layer 19. In the present case, electrically conductive layer 9 is contacted laterally at the areas having emitter doping 26, collector doping 25, and conductive layer doping 24.

Figure 13:
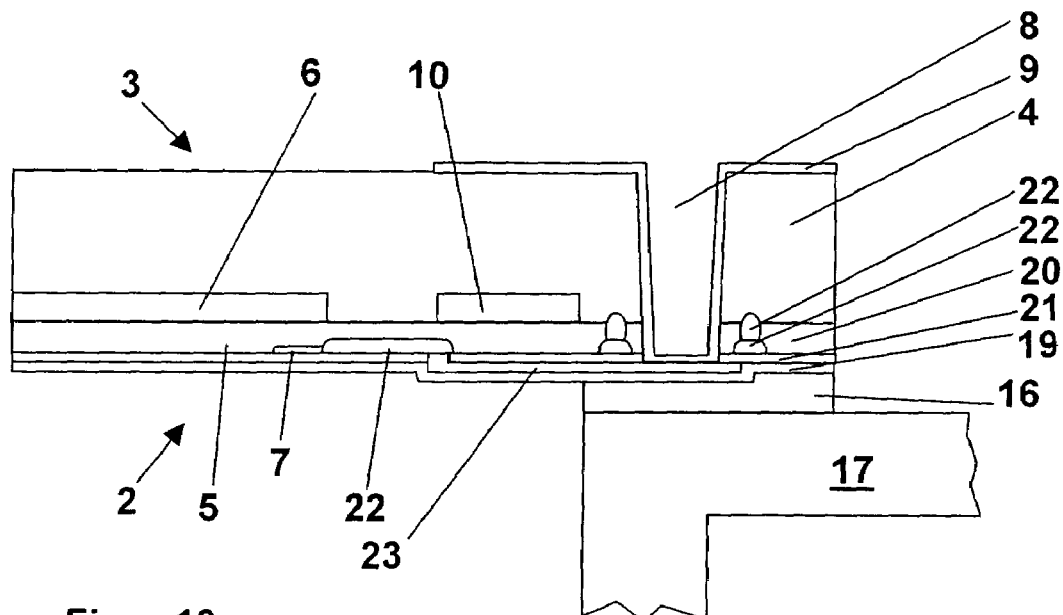

One exemplary embodiment having a trenched contact hole 8 is illustrated in FIG. 13. The trench etching process is stopped by oxide layer 21. This oxide layer is opened by wet chemical means or by plasma, e.g., using the same back side masking as for the trench. An oxide etch stop is provided on metal conductor 23. In this exemplary embodiment, metal conductor 23 does not extend through oxide layer 21, but instead contact hole 8 extends through oxide layer 21 and therefore is in direct contact with electrically conductive layer 9. Insulating areas 22 are provided around contact hole 8 by doping, thereby advantageously avoiding leakage currents.

Figure 14:
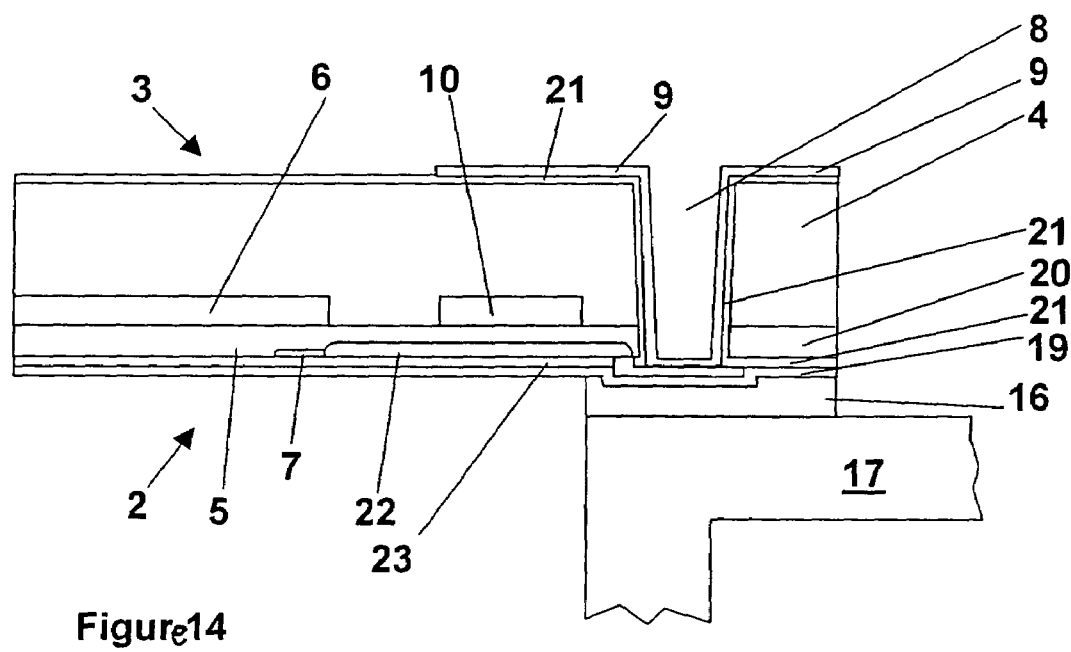

A further exemplary embodiment is illustrated in FIG. 14. The same as in FIG. 13, contact hole 8 is introduced into substrate 4 by trench etching. The manufacture is therefore likewise similar. In this case, the surface of the contact hole and back side 3 of substrate 4 are additionally covered by oxide layer 21. It is understood by those skilled in the art that this oxide layer 21 must be deposited before back-side metal-plating 9 is applied and patterned on substrate 4. Instead of an oxide layer, any other suitable type of insulating layer may be applied which is suitable as insulation between substrate 4 and electrically conductive surface 9. The additional insulating layer, i.e., oxide layer 21, which covers the base of contact hole 8 during the production process, is advantageously opened together with oxide layer 21 on front side 2 of substrate 4. The embodiments shown in FIGS. 11 and 12 having anisotropically etched contact holes 8 may also be provided with an additional oxide layer 23 under metal-plating 9 to ensure electrical insulation with respect to substrate 4.

FIG. 14 also shows an alternative design for contacting between sensor area 7 and electrically conductive surface 9 of contact hole 8. The contact is made via a doped insulating area 22 which extends almost to contact hole 8. The contact with metal conductor 23 is made in the area in which front side 2 of substrate 4 is connected to housing 17 by adhesive or solder 16. This has the advantage that metal conductor 23, which runs close to the surface of front side 2, is not exposed to medium 14, which may be significant in particular for corrosive media, since passivation layer 19 may, for example, have defects.

What is claimed is:

1. A micromechanical pressure sensor system, comprising:
    a substrate having a front side and a back side, wherein the front side faces a medium and the back side is situated on an opposite side of the substrate from the front side; and
    a sensor diaphragm having at least one sensor area situated on the front side and one of a recess and a cavity situated on a side of the sensor diaphragm facing away from the front side; and
    a stress-decoupling arrangement situated around the sensor diaphragm, wherein the stress-decoupling arrangement is one of: a) a circular groove introduced into the front side; and b) a decoupling diaphragm which annularly surrounds the sensor diaphragm inside the substrate;
    wherein:
        the at least one sensor area is electrically contacted with the back side;
        the sensor system includes at least one contact hole which extends from the back side into the substrate and up to one of: a) the front side; and b) a layer provided on the front side; and
        at least a part of at least one of the back side and the contact hole is provided with an electrically conductive layer which includes at least one of aluminum, chromium, titanium and gold.

2. The sensor system as recited in claim 1, wherein the electrical contacting of the at least one sensor area with the back side is by at least one of metallic conductors and doping of areas of the substrate.

3. The sensor system as recited in claim 1, wherein at least one of the contact hole and the circular groove is produced by one of an anisotropic etching and a trench etching process.

4. The sensor system as recited in claim 1, wherein the back side has at least one electrical contact area which is connected to a printed circuit board in an electrically conductive manner by one of: a) a bonding wire; and b) a direct flip-chip connection.

5. The sensor system as recited in claim 1, wherein a deflection of the sensor diaphragm is detected one of piezoresistively and capacitively, and wherein the deflection of the sensor diaphragm is evaluated by an evaluation circuit.

6. A method for manufacturing a micromechanical pressure sensor system including a substrate and a sensor diaphragm, the substrate having a front side and a back side, wherein the front side faces a medium and the back side is situated on an opposite side of the substrate from the front side, and the sensor diaphragm having at least one sensor area situated on the front side and one of a recess and a cavity situated on a side of the sensor diaphragm facing away from the front side, the method comprising:

providing an electrical connection between the sensor area and the back side by:
 a) introducing, by one of an anisotropic etching and trenching, at least one contact hole into the substrate which extends from the back side into the substrate and up to one of: a) the front side; and b) a layer provided on the front side;
 b) providing at least a part of at least one of the back side and the contact hole with a metal layer by using at least one of a photolithography process, sputtering deposition and vapor deposition; and
 c) providing an electrical contact arrangement for electrically contacting the sensor area with the back side by at least one of metallic conductors and doping of areas of the substrate; and providing a stress-decoupling arrangement situated around the sensor diaphragm by one of:
 a) introducing a circular groove into the front side; and
 b) annularly surrounding the sensor diaphragm with a decoupling diaphragm inside the substrate;

wherein the metal layer is an electrically conductive layer which includes at least one of aluminum, chromium, titanium and gold.

7. The method as recited in claim 6, further comprising:
introducing at least one of the sensor diaphragm and the decoupling diaphragm into the substrate by porously etching at least a portion of the substrate to a porosity of greater than 50%, wherein the cavity is formed by one of displacing and removing parts of the substrate material in the porously etched portion.

* * * * *